(12) United States Patent
You

(10) Patent No.: US 8,511,564 B2
(45) Date of Patent: Aug. 20, 2013

(54) SYSTEM INCLUDING SEMICONDUCTOR DEVICES AND CONTROLLER AND METHOD FOR OPERATING THE SAME

(75) Inventor: Jung-Taek You, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 468 days.

(21) Appl. No.: 12/943,354

(22) Filed: Nov. 10, 2010

(65) Prior Publication Data
US 2012/0010731 A1 Jan. 12, 2012

(30) Foreign Application Priority Data

Jul. 6, 2010 (KR) ........................ 10-2010-0065011

(51) Int. Cl.
*G06K 13/00* (2006.01)
(52) U.S. Cl.
USPC ...................................................... 235/476
(58) Field of Classification Search
USPC ................... 235/436, 439, 476, 487, 492
See application file for complete search history.

(56) References Cited

U.S. PATENT DOCUMENTS

| | | | |
|---|---|---|---|
| 5,565,857 A * | 10/1996 | Lee | 340/5.42 |
| 8,065,589 B2 * | 11/2011 | Iida | 714/763 |
| 2006/0038024 A1* | 2/2006 | Nakadai et al. | 235/492 |
| 2007/0040038 A1* | 2/2007 | Kasuga | 235/492 |

FOREIGN PATENT DOCUMENTS

| | | |
|---|---|---|
| JP | 06349283 A * | 12/1994 |
| JP | 2007-323723 | 12/2007 |
| KR | 1020020005960 | 1/2002 |
| KR | 100535648 | 12/2005 |
| KR | 1020070058879 | 6/2007 |
| KR | 1020070101411 | 10/2007 |
| KR | 1020080111329 | 12/2008 |

OTHER PUBLICATIONS

Notice of Allowance issued from Korean Intellectual Property Office on Sep. 30, 2011.

* cited by examiner

*Primary Examiner* — Seung Lee
(74) *Attorney, Agent, or Firm* — IP & T Group LLP

(57) ABSTRACT

A semiconductor device includes a device identification detection code output block configured to output a device identification detection code to an outside of the semiconductor device when the semiconductor device enters an identification (ID) read mode, a code comparison block configured to compare a device selection code applied from the outside with the device identification detection code when the semiconductor device enters a device selection mode, and generate a device matching signal based on a comparison result, and an internal circuit block configured to decide whether to perform a predetermined internal operation based on the device matching signal when the semiconductor device enters an operation control mode.

29 Claims, 8 Drawing Sheets

SYSTEM INCLUDING SEMICONDUCTOR DEVICES AND CONTROLLER AND METHOD FOR OPERATING THE SAME

CROSS-REFERENCE TO RELATED APPLICATIONS

The present application claims priority of Korean Patent Application No. 10-20100065011, filed on Jul. 6, 2010, which is incorporated herein by reference in its entirety.

BACKGROUND OF THE INVENTION

Exemplary embodiments of the present invention relate to a semiconductor design technology, and more particularly, to a semiconductor module including a plurality of semiconductor chips or devices.

Technological advancement in semiconductor fabrication technology has been decreasing the size of semiconductor devices. As a chip stack packaging technology develops and demand for a high-capacity semiconductor module increases, the number of semiconductor devices or chips mounted on one semiconductor module increases as well. A semiconductor module is a system including a plurality of semiconductor devices or chips. Although a defect does not often occur in the semiconductor packaging process, the chances for a defect occurring in the process of fabricating the semiconductor module are increasing.

Also, as the platform for semiconductor devices or chips becomes diverse, the kind of semiconductor module employing the semiconductor devices or chips becomes diverse too. Thus, the occurrence of the defect in a particular semiconductor module is on the rise.

If a semiconductor device or chip is detected to have a defect before being modularized, only the defective semiconductor device or chip may be abandoned. Therefore, the expenses due to the loss can be reduced in this stage. However, when a semiconductor module employing a plurality of semiconductor devices or chips is detected to have a defect after the fabrication of the semiconductor module, the expenses due to the loss may be enormous because the loss may include the fabrication costs of the plurality of semiconductor devices or chips of the semiconductor module.

SUMMARY OF THE INVENTION

Exemplary embodiments of the present invention are directed to a system that makes a plurality of semiconductor chips or devices included in a semiconductor module respectively perform a predetermined internal operation, and a method for operating the system.

In accordance with an exemplary embodiment of the present invention, a semiconductor device includes a device identification detection code output block configured to output a device identification detection code to an outside of the semiconductor device, a code comparison block configured to compare a device selection code applied from the outside with the device identification detection code, and generate a device matching signal based on a comparison result, and an internal circuit block configured to decide whether to perform a predetermined internal operation based on the device matching signal.

In accordance with another exemplary embodiment of the present invention, a semiconductor module includes a device identification detection code output block configured to output a plurality of device identification detection codes to an outside of the semiconductor module, a code comparison block configured to compare a device selection code applied from the outside with each of the plurality of the device identification detection codes and generate a plurality of device matching signals based on comparison results, and a plurality of semiconductor devices corresponding to respective device identification detection codes and configured to determine whether to perform predetermined internal operations in response to the plurality of the device matching signals.

In accordance with yet another exemplary embodiment of the present invention, a system includes a plurality of semiconductor devices configured to output a plurality of predetermined device identification detection codes, respectively, compare a device selection code with each of the plurality of the device identification detection codes, and determine whether to perform predetermined internal operations based on the comparison results, and a controller configured to transfer at least one code of the plurality of the device identification detection codes to the plurality of the semiconductor device as the device selection code.

In accordance with still another exemplary embodiment of the present invention, a method for operating a system including a plurality of semiconductor devices and a controller of the plurality of the semiconductor devices, includes storing a plurality of device identification detection codes respectively corresponding to the plurality of the semiconductor devices in the controller when the system enters an identification (ID) read mode, selecting at least one among the plurality of the semiconductor devices by transferring at least one code among the plurality of the device identification detection codes stored in the controller as a device selection code to the plurality of the semiconductor devices when the system enters a device selection mode, and controlling the selected semiconductor device to perform a predetermined internal operation when the system enters an operation control mode.

DESCRIPTION OF SPECIFIC EMBODIMENTS

Figure 1:
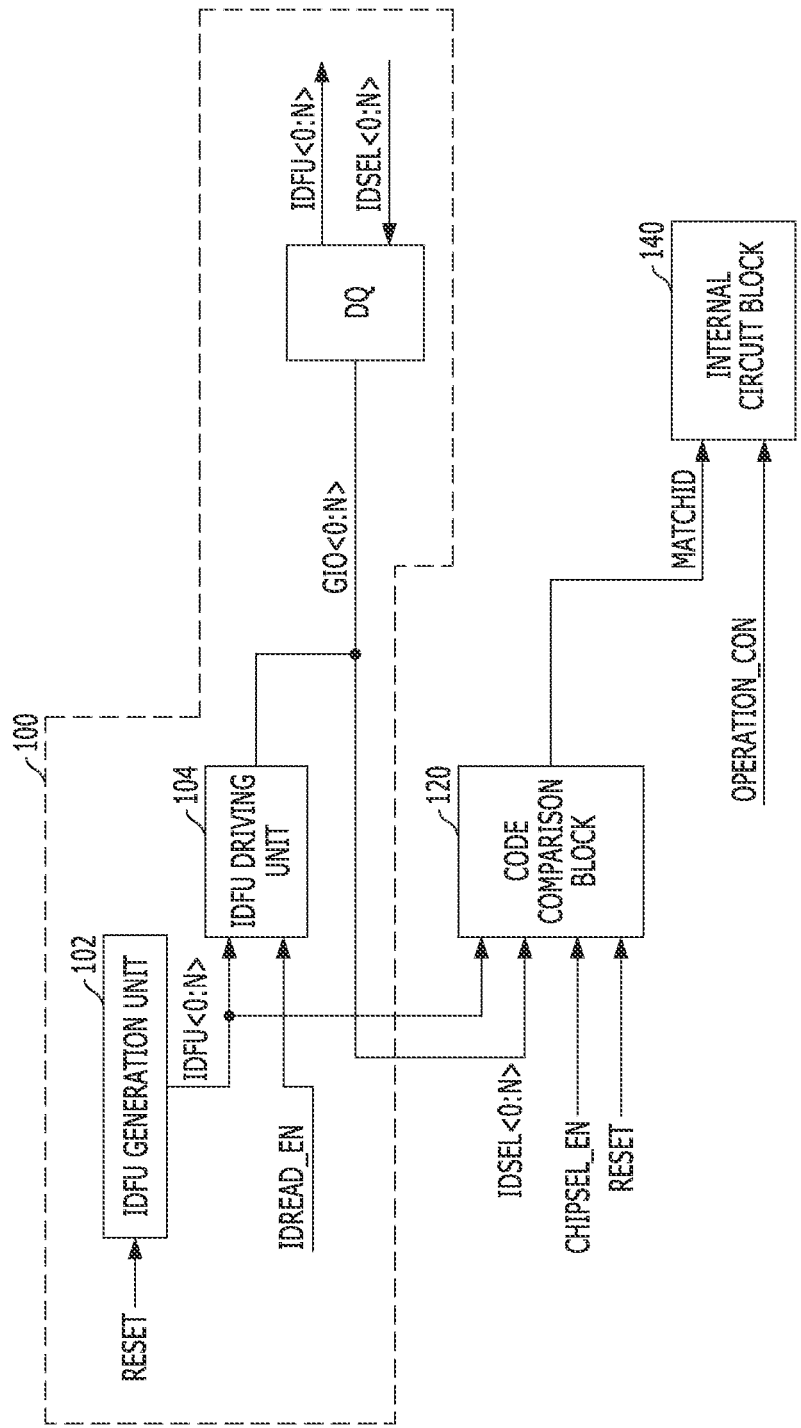
FIG. 1 is a block diagram illustrating a semiconductor device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor device in accordance with an exemplary embodiment of the present invention.

Referring to FIG. 1, the semiconductor device includes a device identification detection code (IDFU) output block 100, a code comparison block 120, and an internal circuit block 140. The IDFU output block 100 outputs a device identification (ID) detection code IDFU<0:N> when the semiconductor device enters an ID read mode (not shown). The code comparison block 120 compares a device selection code IDSEL<0:N> applied from the outside with the ID detection code IDFU<0:N> when the semiconductor device enters a device selection mode (not shown), and generates a device matching signal MATCHID based on the comparison result. The ID detection code IDFU<0:N> and the device selection code IDSEL<0:N> may include one or more signals and/or one or more values. The internal circuit block 140 determines whether to perform a predetermined internal operation based on the device matching signal MATCHID, when the semiconductor device enters an operation control mode (not shown).

Herein, the IDFU output block 100 includes an IDFU generation unit 102, and an IDFU driving unit 104. The IDFU generation unit 102 generates the ID detection code IDFU<0:N>, which is predetermined through a fuse set, in response to a reset signal RESET. The IDFU driving unit 104 drives the ID detection code IDFU<0:N> to a global input/output line GIO<0:N> and outputs it to the outside through a predetermined data input/output pad DQ in response to an ID output enable signal IDREAD_EN which decides whether to enter the ID read mode or not.

Figure 6:
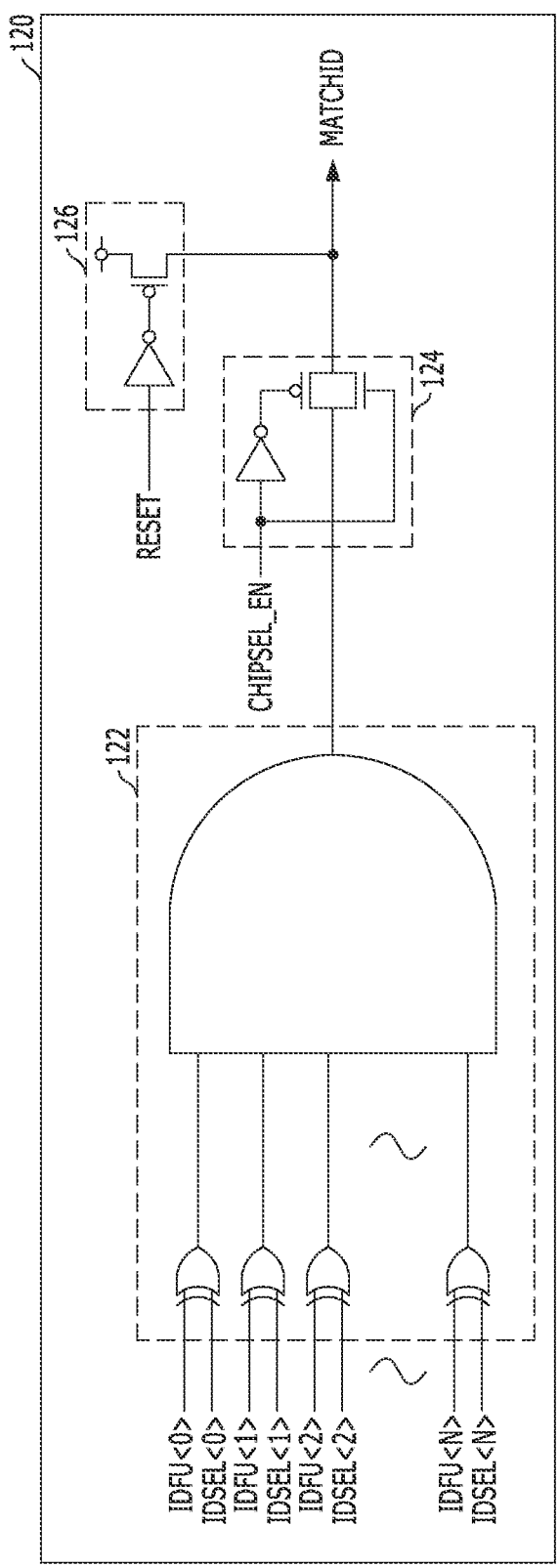
FIG. 6 is a circuit diagram illustrating a code comparison block among the constituent elements of the semiconductor device shown in FIG. 1 in accordance with an exemplary embodiment of the present invention.

Referring to FIG. 6, which is a circuit diagram illustrating the code comparison block 120, the code comparison block 120 includes a comparison unit 122, a MATCHID output unit 124, and a forcible enabling unit 126. The comparison unit 122 compares the device selection code IDSEL<0:N>, which is applied from the outside through a predetermined data input/output pad DQ, with the ID detection code IDFU<0:N>. The MATCHID output unit 124 outputs a signal outputted from the comparison unit 122 as the device matching signal MATCHID in response to a device selection enable signal CHIPSEL_EN, which decides whether to enter the device selection mode or not. The forcible enabling unit 126 forcibly enables the device matching signal MATCHID in response to the reset signal RESET, regardless of the output signal of the comparison unit 122.

Hereafter, an operation of the semiconductor device having the above-described structure in accordance with an exemplary embodiment of the present invention is described.

Figure 4:
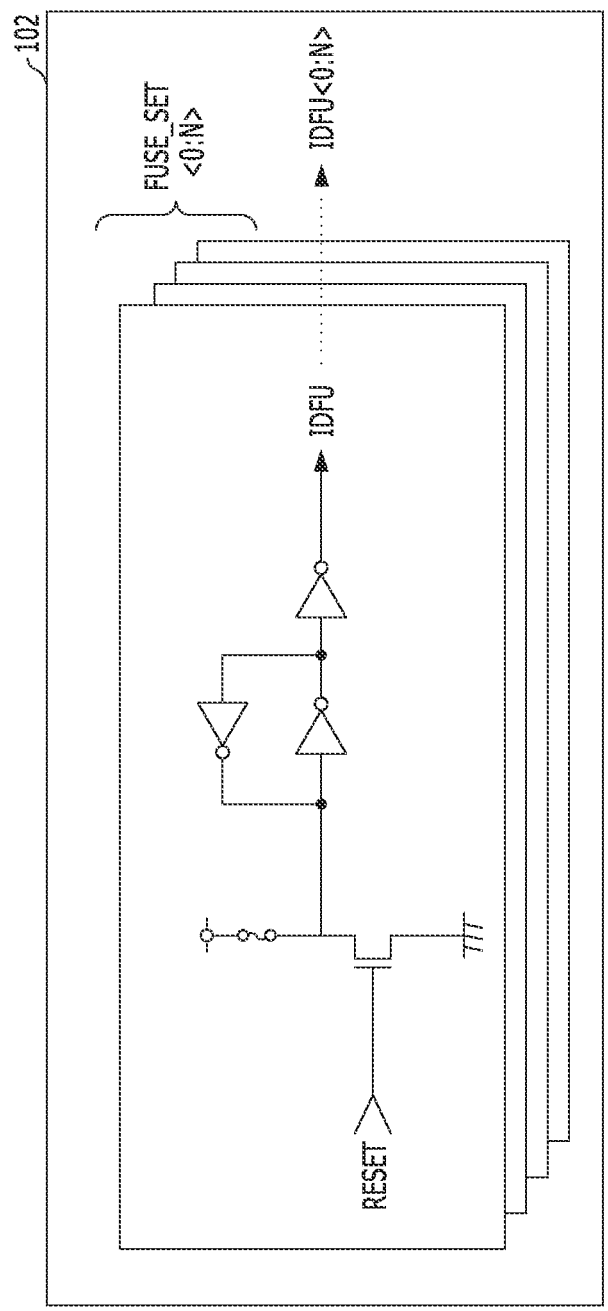
FIG. 4 is a circuit diagram illustrating an IDFU generation unit among the constituent elements of the semiconductor device shown in FIG. 1 in accordance with an exemplary embodiment of the present invention.

Referring to FIG. 4, the operation of the IDFU generation unit 102 among the constituent elements of the IDFU output block 100 is described hereafter. FIG. 4 is a circuit diagram illustrating the IDFU generation unit 102 of the semiconductor device shown in FIG. 1 in accordance with an exemplary embodiment of the present invention. The IDFU generation unit 102 outputs the ID detection code IDFU<0:N> having values determined by a plurality of fuse sets FUSE SET<0:N> in response to the reset signal RESET, when the semiconductor device is initialized.

In other words, if a fuse set FUSE SET<N> is a cut state in the circuit shown in FIG. 4, the IDFU generation unit 102 outputs the ID detection code IDFU<N> transitioning to a logic low level when the reset signal RESET is enabled. If the fuse set FUSE SET<N> is in an uncut state in the circuit shown in FIG. 4, the IDFU generation unit 102 outputs the ID detection code IDFU<0:N> transitioning to a logic high level when the reset signal RESET is enabled.

The ID detection code IDFU<0:N> generated when the reset signal RESET is enabled is latched and sustained in the IDFU generation unit 102 until the IDFU driving unit 104 drives it to the global input/output line GIO<0:N> in response to the ID output enable signal IDREAD_EN.

Figure 5:
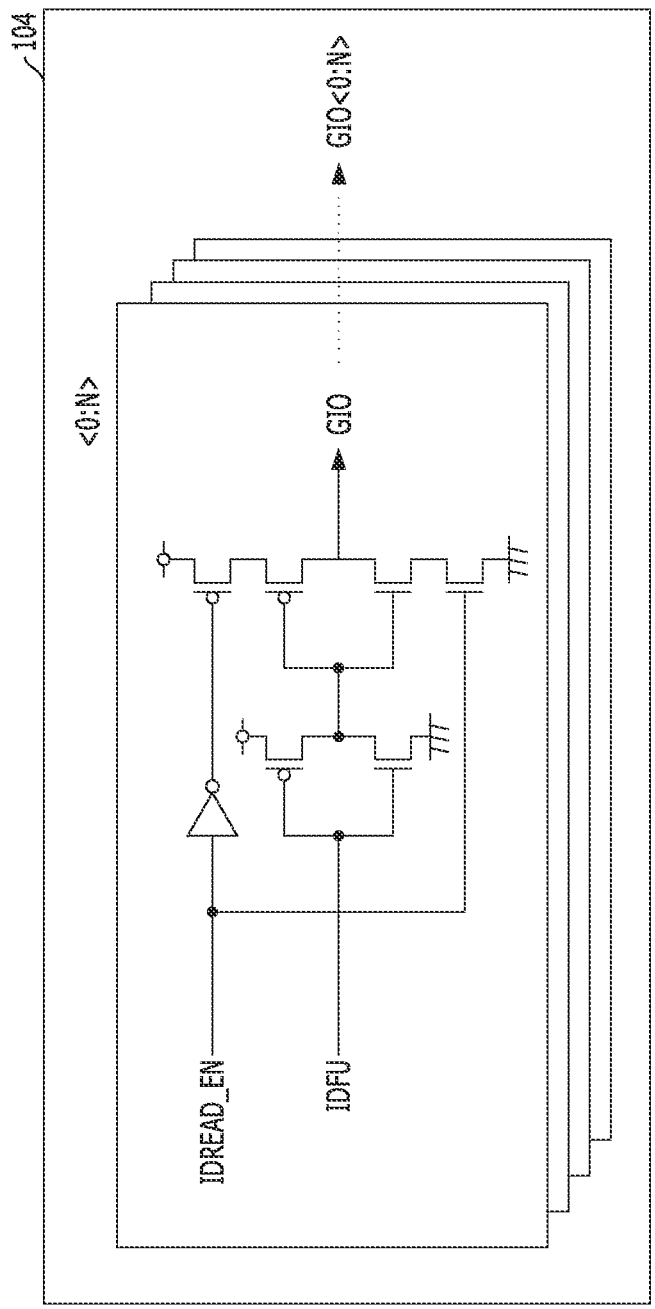
FIG. 5 is a circuit diagram illustrating an IDFU driving unit among the constituent elements of the semiconductor device shown in FIG. 1 in accordance with an exemplary embodiment of the present invention.

Referring to FIG. 5, the operation of the IDFU driving unit 104 among the constituent elements of the IDFU output block 100 is described hereafter. FIG. 5 is a circuit diagram illustrating the IDFU driving unit 104 of the semiconductor device shown in FIG. 1 in accordance with an exemplary embodiment of the present invention. The IDFU driving unit 104 drives the ID detection code IDFU<0:N>, which is formed of multiple bits, in parallel to the multiple global input/output lines GIO<0:N> in response to the ID output enable signal IDREAD_EN being enabled to a logic high level.

Meanwhile, the IDFU driving unit 104 stops driving the ID detection code IDFU<0:N>, which is formed of multiple bits, in parallel to the multiple global input/output lines GIO<0:N> in response to the ID output enable signal IDREAD_EN being disabled to a logic low level.

In short, the IDFU output block 100 outputs the ID detection code IDFU<0:N> to the outside of the semiconductor device when the semiconductor device enters the ID read mode, and does not output the ID detection code IDFU<0:N> to the outside of the semiconductor device when the semiconductor device exits the ID read mode.

The code comparison block 120 compares the device selection code IDSEL<0:N> applied from the outside through a predetermined data input/output pad DQ with the ID detection code IDFU<0:N> generated in the IDFU generation unit 102 in response to the device selection enable signal CHIPSEL_EN which decides whether to enter the device selection mode. If the device selection code IDSEL<0:N> and the ID detection code IDFU<0:N> are the same, the code comparison block 120 enables the device matching signal MATCHID and outputs the enabled device matching signal MATCHID. If the device selection code IDSEL<0:N> and the ID detection code IDFU<0:N> are not the same, the code comparison block 120 disables the device matching signal MATCHID and outputs the disabled device matching signal MATCHID. The code comparison block 120 enables the device matching signal MATCHID and outputs the enabled device matching signal MATCHID in response to the reset signal RESET regardless of the comparison result.

Referring to FIG. 6, while the device selection enable signal CHIPSEL_EN is enabled to a logic high level, it is decided whether all the bits of the ID detection code IDFU<0:N> and all the bits of the device selection code IDSEL<0:N> are the same. If they are the same, the device matching signal MATCHID is enabled to a logic high level and outputted. If they are not the same, that is, if even one bit is different, the device matching signal MATCHID is disabled to a logic low level and outputted.

Also, while the device selection enable signal CHIPSEL_EN is disabled to a logic low level, the device matching signal MATCHID is maintained, regardless of the result of comparing the ID detection code IDFU<0:N> with the device selection code IDSEL<0:N>.

Meanwhile, it may be seen that the device matching signal MATCHID is unconditionally enabled to a logic high level in response to the reset signal RESET enabled to a logic high level.

The internal circuit block 140 performs a predetermined internal operation when an operation control enable signal OPERATION_CON is enabled to a logic high level, which determines whether to enter an operation control mode or not, while the device matching signal MATCHID is enabled to a logic high level. While the device matching signal MATCHID is disabled to a logic low level, the internal circuit block 140 does not perform the predetermined internal operation even when the operation control enable signal OPERATION_CON is enabled.

In other words, when the ID detection code IDFU<0:N> generated inside of the semiconductor device is the same as the device selection code IDSEL<0:N>, the internal circuit block 140 performs the predetermined internal operation in response to the operation control enable signal OPERATION_CON.

Therefore, the internal circuit block 140 does not perform the predetermined internal operation although the operation control enable signal OPERATION_CON is enabled, unless the ID detection code IDFU<0:N> generated in the inside of the semiconductor device is the same as the device selection code IDSEL<0:N> (e.g., all bits are the same).

Herein, the predetermined internal operation of the semiconductor device may be an operation of controlling an electrical fuse cutting operation for cutting an electrical fuse (e-fuse) mounted on the inside of the semiconductor device. The electrical fuse cutting operation is a method widely used to control a fuse of a semiconductor device even after the semiconductor device is packaged. The electrical fuse cutting operation may be performed to change the internal operation setup of the semiconductor device or to perform a repair operation. Since the electrical fuse cutting operation is a known technology, it is not described in detail herein.

Also, the predetermined internal operation of the semiconductor device may be an operation of controlling a setting operation of a mode register set (MRS) mounted on the inside of the semiconductor device. The setting operation of a mode register set (MRS) is widely used in the field of semiconductor devices as a method of pre-setting the internal operation of a semiconductor device according to the intention of a designer of the semiconductor device. Since the setting operation is also a known technology, it is not described in detail herein.

Figure 2:
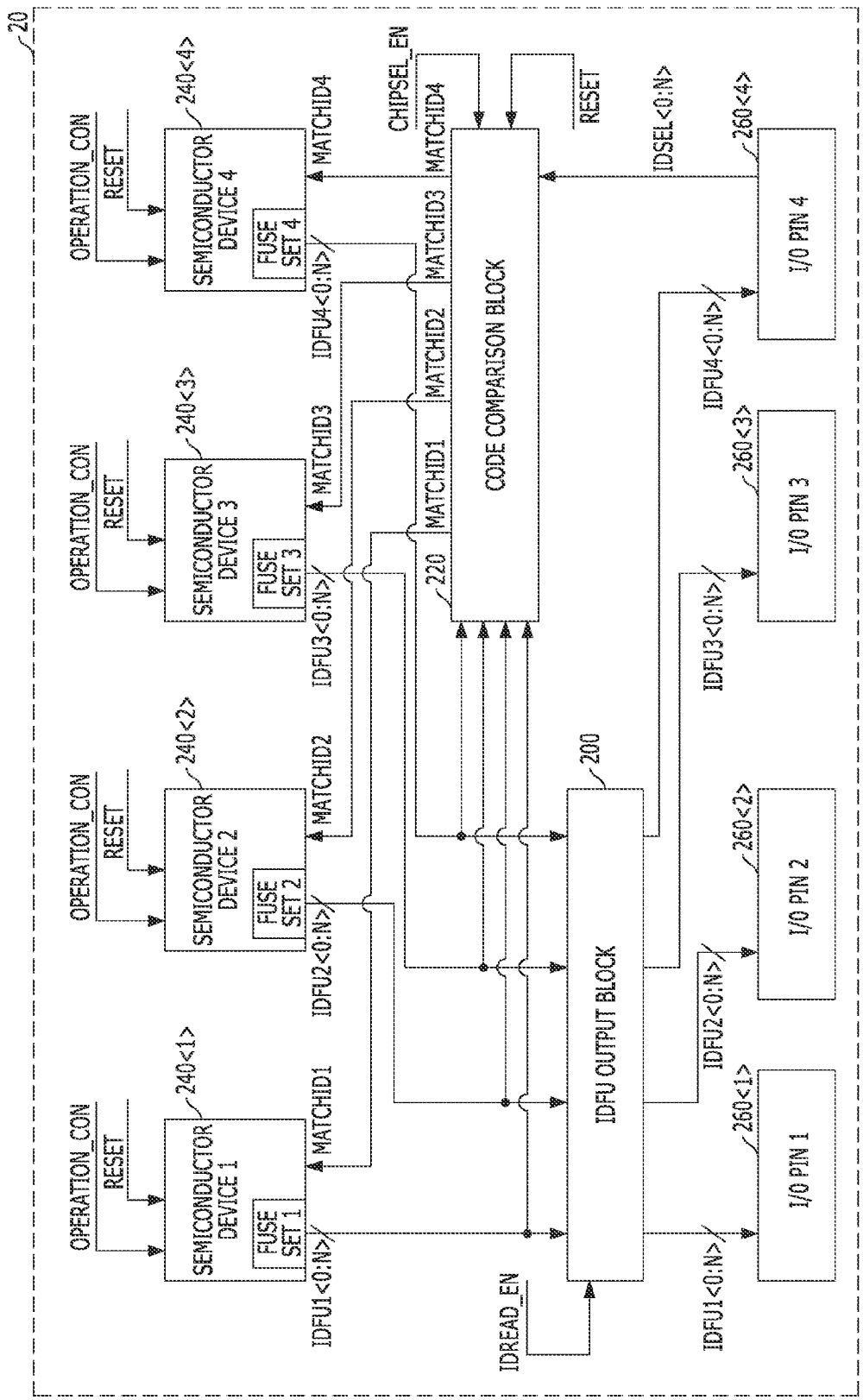
FIG. 2 is a block diagram illustrating a semiconductor module in accordance with an exemplary embodiment of the present invention.

FIG. 2 is a block diagram illustrating a semiconductor module in accordance with an exemplary embodiment of the present invention.

Referring to FIG. 2, a semiconductor module 20 in accordance with an exemplary embodiment of the present invention includes an IDFU output block 200, a code comparison block 220, and a plurality of semiconductor devices 240<1:4>. The IDFU output block 200 outputs a plurality of ID detection codes IDFU1<0:N>, IDFU2<0:N>, IDFU3<0:N> and IDFU4<0:N> respectively provided by the plurality of the semiconductor devices 240<1:4>. More specifically, the IDFU output block 200 outputs the plurality of ID detection codes IDFU1<0:N>, IDFU2<0:N>, IDFU3<0:N> and IDFU4<0:N> to the outside of the semiconductor module 20, when the semiconductor module 20 enters the ID read mode (not shown). The code comparison block 220 compares the device selection code IDSEL<0:N>, which is applied from outside of the semiconductor module 20, with each of the plurality of the ID detection codes IDFU1<0:N>, IDFU2<0:N>, IDFU3<0:N> and IDFU4<0:N>, so as to produce comparison results. Moreover, the code comparison block 220 generates a plurality of device matching signals MATCHID1, MATCHID2, MATCHID3 and MATCHID4 based on the comparison results, when the semiconductor module 20 enters the chip selection mode (not shown). The semiconductor devices 240<1:4> decide whether to perform the predetermined internal operations in response to the plurality of the device matching signals MATCHID1, MATCHID2, MATCHID3 and MATCHID4, when the semiconductor module 20 enters the operation control mode (not shown).

Also, the semiconductor module 20 includes a plurality of input/output pins 260<1>, 260<2>, 260<3>, and 260<4> for outputting the ID detection code IDFU<0:N>, which are outputted from the IDFU output block 200, to the outside of the semiconductor module 20. Moreover, the plurality of input/output pins 260<1>, 260<2>, 260<3>, and 260<4> may receive the device selection code IDSEL<0:N> from the outside of the semiconductor module 20. The plurality of the input/output pins 260<1>, 260<2>, 260<3>, and 260<4> have a one-to-one correspondence with the plurality of the semiconductor devices 240<1:4>. For example, a first semiconductor device 240<1> receives/outputs data through a corresponding first input/output pin 260<1> among the plurality of the input/output pins 260<1>, 260<2>, 260<3>, and 260<4>, while a second semiconductor device 240<2> receives/outputs data through a corresponding second input/output pin 260<2>.

Herein, although FIG. 2 shows four semiconductor devices 240<1:4> mounted on the inside of the semiconductor module 20, this is assumed for the sake of convenience in description, and it should be understood that more or fewer than four semiconductor devices may be mounted on the semiconductor module 20.

Also, FIG. 4 is depicted as if the device selection code IDSEL<0:N> is applied only through a fourth input/output pin 260<4> among the plurality of the input/output pins 260<1>, 260<2>, 260<3>, and 260<4>. However, this is for convenience, and it should be understood that the device selection code IDSEL<0:N> may be applied through the plurality of the input/output pins 260<1>, 260<2>, 260<3>, and 260<4> individually, or the device selection code IDSEL<0:N> may be inputted through some selected input/output pins among the plurality of the input/output pins 260<1>, 260<2>, 260<3> and 260<4>.

The operation of the semiconductor module 20 with the plurality of the semiconductor devices 240<1:4> in accordance with an exemplary embodiment of the present invention is described hereafter.

First, the IDFU output block 200 outputs the plurality of the ID detection codes IDFU1<0:N>, IDFU2<0:N>, IDFU3<0:N>, and IDFU4<0:N>, which are generated inside of the respective semiconductor devices 240<1:4>, to the outside of the semiconductor module 20 through the plurality of the input/output pins 260<1:4>, which are set up for the respective semiconductor devices 240<1:4>, in response to the reset signal RESET in a duration where the ID output enable signal IDREAD_EN, which is a signal indicating whether to enter the ID read mode or not, is enabled.

Also, the IDFU output block 200 does not output the plurality of the ID detection codes IDFU1<0:N>, IDFU2<0:N>, IDFU3<0:N> and IDFU4<0:N> to the outside of the semiconductor module 20 in response to the reset signal RESET in a duration where the ID output enable signal IDREAD_EN is disabled.

To be specific, the IDFU output block 200 performs an operation of transferring the plurality of the ID detection codes IDFU1<0:N>, IDFU2<0:N>, IDFU3<0:N> and IDFU4<0:N>, respectively generated in the plurality of the semiconductor devices 240<1:4>, to the plurality of the input/output pins 260<1:4>, when the ID output enable signal IDREAD_EN is enabled to a logic high level.

The IDFU output block 200, however, does not transfer the plurality of the device identification detection codes IDFU1<0:N>, IDFU2<0:N>, IDFU3<0:N> and IDFU4<0:N> to the plurality of the input/output pins 260<1:4>, when the ID output enable signal IDREAD_EN is disabled to a logic low level.

Herein, a first ID detection code IDFU1<0:N>, generated in the first semiconductor device 240<1> among the plurality of the semiconductor devices 240<1:4>, is outputted through a first input/output pins 260<1> among the plurality of the input/output pins 260<1:4>. Meanwhile, a second ID detection code IDFU2<0:N>, generated in a second semiconductor device 240<2>, is outputted through a second input/output pins 1260<2> among the plurality of the input/output pins 260<1:4>. In short, the plurality of the ID detection codes IDFU1<0:N>, IDFU2<0:N>, IDFU3<0:N> and IDFU4<0:N> are respectively outputted through the plurality of the input/output pins 260<1:4>, which correspond to the respective semiconductor devices 240<1:4>.

The code comparison block 220 compares the device selection code IDSEL<0:N>, applied from outside of the semiconductor memory module 20 through the plurality of the input/output pins 260<1:4>, which respectively correspond to the plurality of the semiconductor devices 240<1:4>, with the plurality of the ID detection codes IDFU1<0:N>, IDFU2<0:N>, IDFU3<0:N>, and IDFU4<0:N> in response to the device selection enable signal CHIPSEL_EN, which is a signal indicating whether to enter the device selection mode or not.

Herein, the code comparison block 220 enables those signals among the plurality of the device matching signals MATCHID1, MATCHID2, MATCHID3 and MATCHID4 that correspond to comparison results indicating that the compared signals are the same, and disables those signals among the plurality of the device matching signals MATCHID1, MATCHID2, MATCHID3 and MATCHID4 that correspond to comparison results indicating that the compared signals are different. The code comparison block 220 also outputs the device matching signals MATCHID1, MATCHID2, MATCHID3 and MATCHID4 to the plurality of the semiconductor devices 240<1:4>, respectively.

Also, the code comparison block 220 enables all of the plurality of the device matching signals MATCHID1, MATCHID2, MATCHID3 and MATCHID4 in response to the reset signal RESET, regardless of the comparison results and outputs the enabled device matching signals to the respective semiconductor devices 240<1:4>.

In other words, the code comparison block 220 compares each of the ID detection codes IDFU1<0:N>, IDFU2<0:N>, IDFU3<0:N> and IDFU4<0:N>, outputted from the respective semiconductor devices 240<1:4>, with one device selection code IDSEL<0:N> applied from the outside of the semiconductor module 20, and enables the device matching signal corresponding to an ID detection code, all bits of which are exactly the same as the device selection code IDSEL<0:N>, to a logic high level.

For example, when all bits of a third ID detection code IDFU3<0:N> among the plurality of the ID detection codes IDFU1<0:N>, IDFU2<0:N>, IDFU3<0:N> and IDFU4<0:N> are the same as all bits of the device selection code IDSEL<0:N> and the other ID detection codes IDFU1<0:N>, IDFU2<0:N>, and IDFU4<0:N> are not the same, the code comparison block 220 enables a third device matching signal MATCHID3 to a logic high level, and disables the other device matching signals MATCHID1, MATCHID2 and MATCHID4 to a logic low level.

Herein, the fact that the third device matching signal MATCHID3 among the plurality of the device matching signals MATCHID1, MATCHID2, MATCHID3 and MATCHID4 is enabled to a logic high level and the other device matching signals MATCHID1, MATCHID2 and MATCHID4 are disabled to a logic low level signifies that a third semiconductor device 240<3> is selected among the plurality of the semiconductor devices 240<1:4> and the other semiconductor devices 240<1>, 240<2>, and 240<4> are not selected.

Also, only one device selection code IDSEL<0:N> is applied from the outside of the semiconductor module 20 at any given time. However, a plurality of device selection codes IDSEL<0:N> may be applied in sequence.

For example, a first device selection code IDSEL<0:N> that is applied first can be controlled to be the same as the first ID detection code IDFU1<0:N> among the plurality of the ID detection codes IDFU1<0:N>, IDFU2<0:N>, IDFU3<0:N> and IDFU4<0:N>, and a second device selection code IDSEL<0:N> that is applied secondly can be controlled to be the same as the fourth ID detection code IDFU4<0:N>.

When the device selection code IDSEL<0:N> is applied through the above two steps, the code comparison block 220 enables the first device matching signal MATCHID1 among the plurality of the device matching signals MATCHID1, MATCHID2, MATCHID3 and MATCHID4 to a logic high level in the first step and enables a fourth device matching signal MATCHID4 to a logic high level in the second step. Thus, in the end, the code comparison block 220 enables the two device matching signals MATCHID1 and MATCHID4 among the plurality of the device matching signals MATCHID1, MATCHID2, MATCHID3 and MATCHID4.

Herein, the fact that the first device matching signal MATCHID1 and the fourth device matching signal MATCHID4 are enabled to a logic high level among the plurality of the device matching signals MATCHID1, MATCHID2, MATCHID3 and MATCHID4 signifies that the first semiconductor device 240<1> and the fourth semiconductor device 240<4> are selected among the plurality of the semiconductor devices 240<1:4> and the other semiconductor devices 240<2> and 240<3> are not selected.

Also, the code comparison block 220 enables the plurality of the device matching signals MATCHID1, MATCHID2, MATCHID3 and MATCHID4 to a logic high level in response to the reset signal RESET enabled. Thus, in this state, even though the device selection code IDSEL<0:N> is not applied to the code comparison block 220 and the code comparison block 220 does not perform the comparison operation, the plurality of the semiconductor devices 240<1:4> are all selected.

The plurality of the semiconductor devices 240<1:4> generate the ID detection code IDFU<0>, IDFU<1>, IDFU<3> and IDFU<4>, respectively, through a fuse set mounted on the inside of each semiconductor device in response to the reset signal RESET, and perform predetermined internal operations when the applied device matching signals MATCHID1, MATCHID2, MATCHID3, or MATCHID4 are enabled and the operation control enable signal OPERATION_CON, which indicates whether to enter the operation control mode or not, is enabled.

Also, the plurality of the semiconductor devices 240<1:4> do not perform the predetermined internal operations when the applied device matching signals MATCHID1, MATCHID2, MATCHID3 and MATCHID4 are disabled and the operation control enable signal OPERATION_CON is disabled.

Since the plurality of the semiconductor devices 240<1:4> are decided to perform the predetermined internal operation corresponding to the respective device matching signal MATCHID1, MATCHID2, MATCHID3, and MATCHID4, a semiconductor device selected through the operation of the code comparison block 220 among the plurality of the semiconductor devices 240<1:4> performs the predetermined internal operation in the operation control mode.

On the contrary, the semiconductor device not selected through the operation of the code comparison block 220 among the plurality of the semiconductor devices 240<1:4> does not perform the predetermined internal operation in the operation control mode.

Herein, the predetermined internal operation of the semiconductor device may be an operation of controlling an electrical fuse cutting operation for cutting an electrical fuse (e-fuse) mounted on the inside of the semiconductor device. The electrical fuse cutting operation is a method widely used to control a fuse of a semiconductor device even after the semiconductor device is packaged. The electrical fuse cutting operation may be performed to change the internal setup of the semiconductor device or to perform a repair operation. Since the electrical fuse cutting operation is a known technology, it is not described in detail herein.

Also, the predetermined internal operation of the semiconductor device may be an operation of controlling a setting operation of a mode register set (MRS) mounted on the inside of the semiconductor device. The setting operation of a mode register set (MRS) is widely used in the field of semiconductor device as a method of pre-setting the internal operation of the semiconductor device according to the intention of a designer of the semiconductor device. Since the setting operation is also a known technology, it is not described in detail herein.

Figure 3:
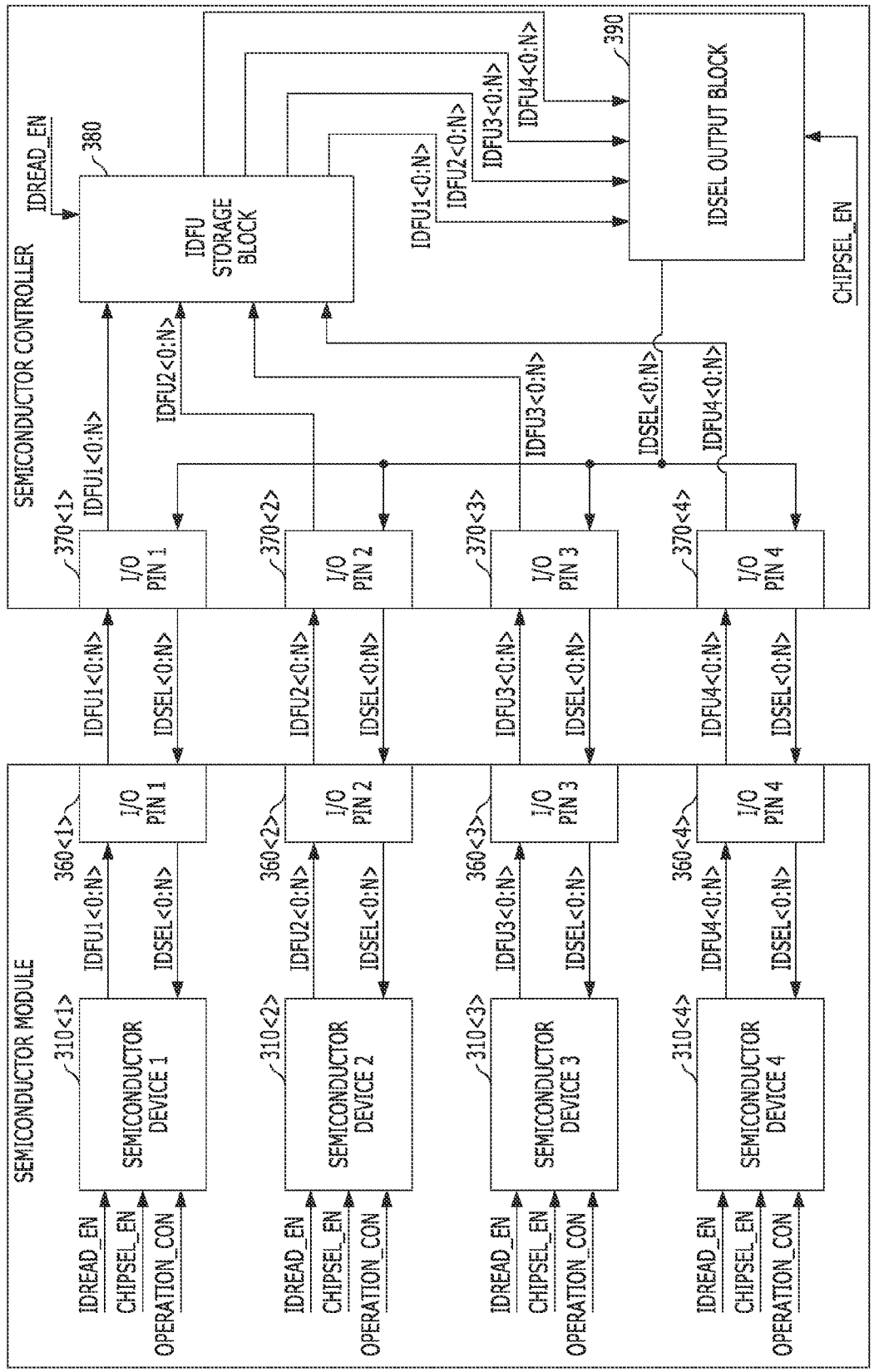
FIG. 3 is a block diagram illustrating a semiconductor system in accordance with an exemplary embodiment of the present invention.

FIG. 3 is a block diagram illustrating a semiconductor system in accordance with an exemplary embodiment of the present invention.

Referring to FIG. 3, the semiconductor system in accordance with an exemplary embodiment of the present invention includes a plurality of semiconductor devices 310<1:4> and a semiconductor controller for commonly controlling the plurality of the semiconductor devices 310<1:4>. The plurality of the semiconductor devices 310<1:4> output a plurality of predetermined ID detection codes IDFU1<0:N>, IDFU2<0:N>, IDFU3<0:N> and IDFU4<0:N> to the semiconductor controller when the semiconductor system enters an ID read mode (not shown). Further, the plurality of the semiconductor devices 310<1:4> compare the device selection code IDSEL<0:N> with each of the plurality of the ID detection codes IDFU1<0:N>, IDFU2<0:N>, IDFU3<0:N> and IDFU4<0:N> when they enter a device selection mode (not shown) so as to produce comparison results. Moreover, the plurality of the semiconductor devices 310<1:4> decide whether to perform predetermined internal operations based on the comparison results when the semiconductor system enters an operation control mode (not shown). The semiconductor controller receives and stores the plurality of the ID detection codes IDFU1<0:N>, IDFU2<0:N>, IDFU3<0:N> and IDFU4<0:N> when the semiconductor system enters the ID read mode, and outputs any one code among the plurality of the ID detection codes IDFU1<0:N>, IDFU2<0:N>, IDFU3<0:N> and IDFU4<0:N> as the device selection code IDSEL<0:N> when the semiconductor system enters the device selection mode.

Herein, the plurality of the semiconductor devices 310<1:4> are included a semiconductor module, and the semiconductor module further includes a plurality of input/output pins 360<1>, 360<2>, 360<3>, and 360<4> which transfer the plurality of the ID detection codes IDFU1<0:N>, IDFU2<0:N>, IDFU3<0:N>, and IDFU4<0:N>, respectively outputted from the plurality of the semiconductor devices 310<1:4>, to the semiconductor controller and transfer the device selection code IDSEL<0:N>, which is transferred from the semiconductor controller, to the plurality of the semiconductor devices 310<1:4>.

Herein, the semiconductor controller includes an IDFU storage block 380 and a device selection code (IDSEL) output block 390. The IDFU storage block 380 stores the plurality of the ID detection codes IDFU1<0:N>, IDFU2<0:N>, IDFU3<0:N>, and IDFU4<0:N> that are respectively transferred from the plurality of the semiconductor devices 310<1:4> in the semiconductor module in response to an ID output enable signal IDREAD_EN. The IDSEL output block 390 selects any one code among the plurality of the ID detection codes IDFU1<0:N>, IDFU2<0:N>, IDFU3<0:N>, and IDFU4<0:N> stored in the IDFU storage block 380 based on a predetermined selection standard and transfers the selected code as the device selection code IDSEL<0:N> to the semiconductor devices 310<1:4> in response to a device selection enable signal CHIPSEL_EN.

Also, the semiconductor controller includes a plurality of input/output pins 370<1:4> for transferring/receiving the plurality of the ID detection codes IDFU1<0:N>, IDFU2<0:N>, IDFU3<0:N>, and IDFU4<0:N> and the device selection code IDSEL<0:N> to/from the semiconductor module.

Herein, the plurality of the input/output 360<1:4> have a one-to-one correspondence with the plurality of the semiconductor devices 310<1:4>. In other words, a first semiconductor device 310<1> among the plurality of the semiconductor devices 310<1:4> receives/outputs a data through a first input/output pin 360<1> among the plurality of the input/output pins 360<1:4>, and a second semiconductor device 310<2> receives/outputs a data through a second input/output pin 360<2>.

Herein, although FIG. 3 illustrates a case where four semiconductor devices 310<1:4> are included in the semiconductor module, this exemplary embodiment is for the sake of convenience in description and more or fewer than four semiconductor devices may be included in the semiconductor module.

Hereafter, an operation of the semiconductor system including a plurality of the semiconductor devices 310<1:4> and the semiconductor controller for commonly controlling the plurality of the semiconductor devices 310<1:4> is described.

First, the plurality of the semiconductor devices 310<1:4> output the plurality of the ID detection codes IDFU1<0:N>, IDFU2<0:N>, IDFU3<0:N>, and IDFU4<0:N>, respectively, which are generated through a fuse set mounted on each semiconductor device. More specifically, the plurality of the ID detection codes IDFU1<0:N>, IDFU2<0:N>, IDFU3<0:N>, and IDFU4<0:N> are output to the semiconductor controller in response to the ID output enable signal IDREAD_EN, which is a signal indicating whether to enter the ID read mode or not.

Also, the plurality of the semiconductor devices 310<1:4> compare one device selection code IDSEL<0:N> applied from the semiconductor controller with the plurality of the ID detection codes IDFU1<0:N>, IDFU2<0:N>, IDFU3<0:N>, and IDFU4<0:N> so as to produce comparison results, decide whether to enable a plurality of device matching signals MATCHID1, MATCHID2, MATCHID3, and MATCHID4 (not shown) based on the comparison results in response to the device selection enable signal CHIPSEL_EN, which is a signal indicating whether to enter the device selection mode or not, and decide whether to perform predetermined internal operations in response to an operation control enable signal OPERATION_CON, which indicates whether to enter an operation control mode or not, and the device matching signals MATCHID1, MATCHID2, MATCHID3 and MATCHID4.

In short, the operation of the plurality of the semiconductor devices 310<1:4> is divided into three modes according to the ID output enable signal IDREAD_EN, the device selection enable signal CHIPSEL_EN, and the operation control enable signal OPERATION_CON.

To be specific, in the ID read mode corresponding to the ID output enable signal IDREAD_EN, the plurality of the ID detection codes IDFU1<0:N>, IDFU2<0:N>, IDFU3<0:N>, and IDFU4<0:N> are transferred to the semiconductor controller to distinguish the plurality of the semiconductor devices 310<1:4> from each other. Through the operation, the semiconductor controller may identify each semiconductor device in the inside of the semiconductor module.

in the device selection mode corresponding to the device selection enable signal CHIPSEL_EN, an operation for selecting a semiconductor device among the plurality of the semiconductor devices 310<1:4> is performed.

In other words, if there is a semiconductor device which has a defect or has an operation setup that needs to be changed among the plurality of the semiconductor devices 310<1:4>, the semiconductor device is selected to repair the defect or change the operation setup. Therefore, a semiconductor device to perform the predetermined internal operation is selected among the plurality of the semiconductor devices 310<1:4> based on the plurality of the ID detection codes IDFU1<0:N>, IDFU2<0:N> IDFU3<0:N>, and IDFU4<0:N> known to the semiconductor controller.

Herein, if the number of semiconductor devices which have a defect or have an operation setup that needs to be changed among the plurality of the semiconductor devices 310<1:4> is more than one, they may be simultaneously selected and go through the operation of repairing the defect or changing the operation setup. Thus, more than one semiconductor device among the plurality of the semiconductor devices 310<1:4> may be selected by repeatedly performing the operation of the device selection mode.

Also, the operation setup of ail of the semiconductor devices 310<1:4> may be changed at once. In this case, repeating the operation of the device selection mode as many times as the number of the plurality of the semiconductor devices 310<1:4> is quite inefficient. Therefore, the operation of the device selection mode may be performed in a state that all of the semiconductor devices 310<1:4> are selected.

In other words, when the number of semiconductor devices which have a defect or have an operation setup that needs to be changed among the plurality of the semiconductor devices 310<1:4> is not more than half (½) of the total number of the semiconductor devices 310<1:4>, it may be controlled to increase the number of the semiconductor devices selected among the plurality of the semiconductor devices 310<1:4> one by one whenever the operation of the device selection mode is repeated. When the number of semiconductor devices which has a defect or has an operation setup that needs to be changed among the plurality of the semiconductor devices 310<1:4> is more than a half (½) of the total number of the semiconductor devices 310<1:4>, it may be controlled to increase the number of the semiconductor devices not selected among the plurality of the selected semiconductor devices 310<1:4> one by one whenever the operation of the device selection mode is repeated.

In the operation control mode corresponding to the operation control enable signal OPERATION_CON, a semiconductor device selected among the plurality of the semiconductor devices 310<1:4> through the device selection mode directly performs a predetermined internal operation. Therefore, only the semiconductor device selected among the plurality of the semiconductor devices 310<1:4> performs the predetermined internal operation, and the other semiconductor devices do not perform the internal operations.

The semiconductor controller stores the plurality of the ID detection codes IDFU1<0:N>, IDFU2<0:N>, IDFU3<0:N>, and IDFU4<0:N>, respectively outputted from the plurality of the semiconductor devices 310<1:4> included in the semiconductor module, in the ID read mode controlled by the ID output enable signal IDREAD_EN, and transfers any one code among the plurality of the ID detection codes IDFU1<0:N>, IDFU2<0:N>, IDFU3<0:N>, and IDFU4<0:N> as the device selection code IDSEL<0:N> to the plurality of the semiconductor devices 310<1:4> in the device selection mode corresponding to the device selection enable signal CHIPSEL_EN.

When the semiconductor system enters the ID read mode, the semiconductor controller distinguishes the plurality of the semiconductor devices 310<1:4> one from another through an operation of storing all of the plurality of the ID detection codes IDFU1<0:N>, IDFU2<0:N>, IDFU3<0:N> and IDFU4<0:N>.

If there is a semiconductor device which has a defect or an operation setup that needs to be changed, the semiconductor controller outputs a ID detection code corresponding to the semiconductor device as the device selection code IDSEL<0:N>. Accordingly, any one semiconductor device is selected among the plurality of the semiconductor devices 310<1:4>.

Also, if plural semiconductor devices have a defect or need to change an operation setup, the semiconductor controller sequentially outputs a plurality of ID detection codes corresponding to the plural semiconductor devices as the device selection codes IDSEL<0:N>. Accordingly, several semiconductor devices are selected among the plurality of the semiconductor devices 310<1:4>.

Herein, the predetermined internal operation of the semiconductor device may be an operation of controlling an electrical fuse cutting operation for cutting an electrical fuse (e-fuse) mounted on the inside of the semiconductor device. The electrical fuse cutting operation is a method widely used to control a fuse of a semiconductor device. The electrical fuse cutting operation may be performed to change the internal operation setup of the semiconductor device or to perform a repair operation. Since the electrical fuse cutting operation is a known technology, it is not described in detail herein.

Also, the predetermined internal operation of the semiconductor device may be an operation of controlling a setting operation of a mode register set (MRS) mounted on the inside of the semiconductor device. The setting operation of a mode register set (MRS) is widely used in the field of semiconductor device as a method of pre-setting the internal operation of the semiconductor device according to the intention of a designer of the semiconductor device. Since the setting operation is also a known technology, it is not described in detail herein.

Figure 7A:
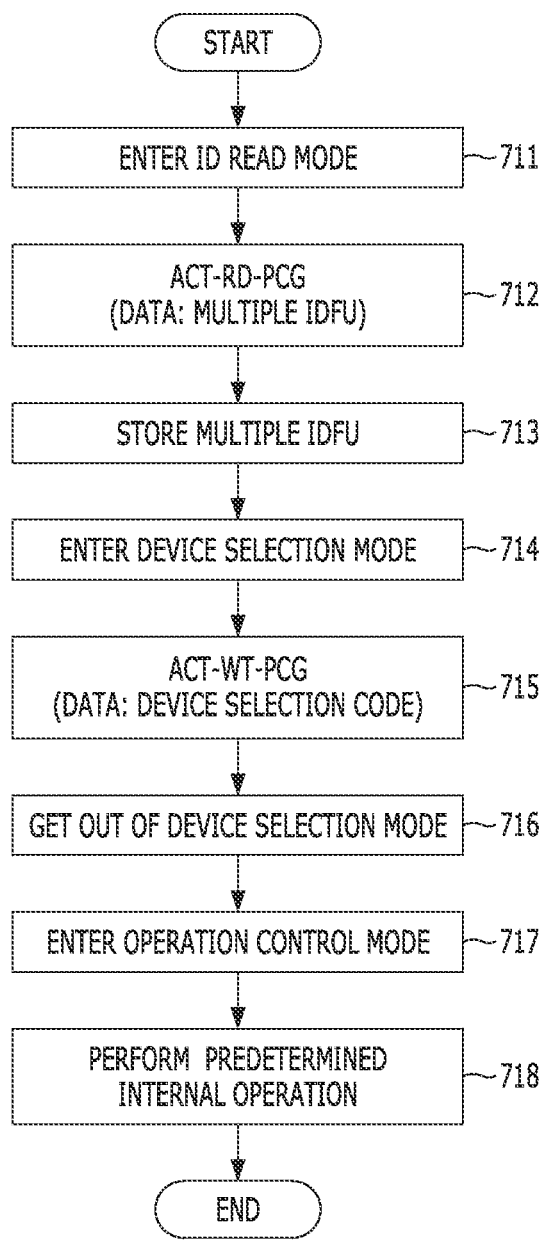
FIG. 7A is a flowchart describing an operation of a semiconductor controller in accordance with an exemplary embodiment of the present invention.

FIG. 7A is a flowchart describing an operation of the semiconductor controller in accordance with an exemplary embodiment of the present invention.

Figure 7B:
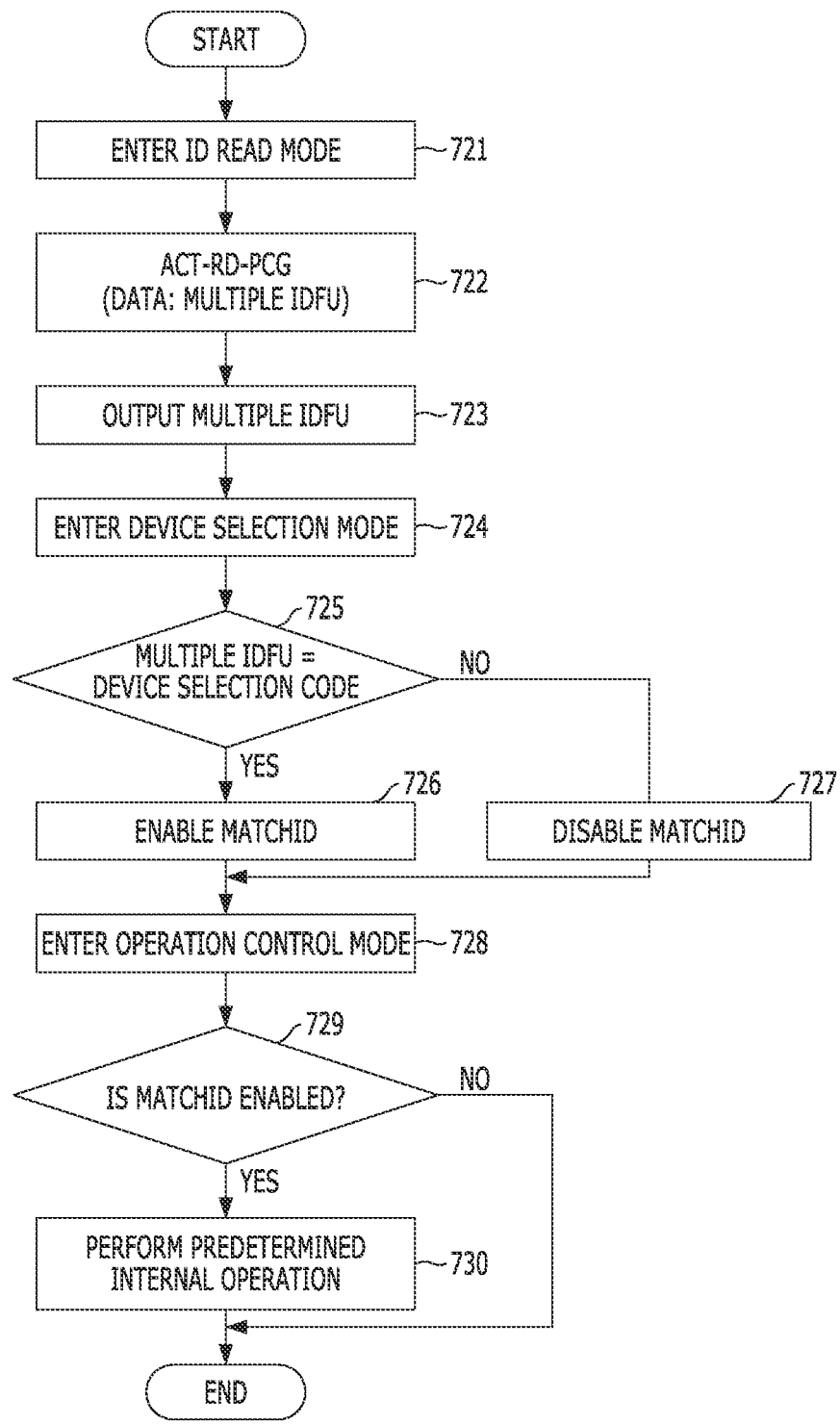
FIG. 7B is a flowchart describing an operation of a semiconductor device in accordance with an exemplary embodiment of the present invention.

FIG. 7B is a flowchart describing an operation of the semiconductor device in accordance with an exemplary embodiment of the present invention.

Referring to FIGS. 3, 7A and 7B, a method for operating the semiconductor system including the plurality of the semiconductor devices 310<1:4> and the semiconductor controller for commonly controlling the plurality of the semiconductor devices 310<1:4> includes performing (step 712 or 722) an active (ACT)-read (RD)-precharge (PCG) operation in each of the plurality of the semiconductor devices 310<1:4> after the semiconductor system enters the ID read mode (step 711 or 721) and then storing (step 713) the plurality of the ID detection codes IDFU1<0:N>, IDFU2<0:N>, IDFU3<0:N>, and IDFU4<0:N> which correspond to the plurality of the semiconductor devices 310<1:4> respectively in the semiconductor controller; performing (step 715) an active (ACT)-write (WT)-precharge (PCG) operation in each of the plurality of the semiconductor devices 310<1:4> after the semiconductor system enters the device selection mode (steps 714 or 724) and selecting any one semiconductor device among the plurality of the semiconductor devices 310<1:4> by transferring any one code among the plurality of the ID detection codes IDFU1<0:N>, IDFU2<0:N>, IDFU3<0:N>, and IDFU4<0:N>, which are stored in the semiconductor controller, as the device selection code IDSEL<0:N> to the plurality of the semiconductor devices 310<1:4>; and controlling a selected semiconductor device to perform a predetermined internal operation (step 718) after the semiconductor system enters the operation control mode (step 717 or 728).

The method for operating the semiconductor system may further include generating (step 723) the plurality of the device identification detection codes IDFU1<0:N>, IDFU2<0:N>, IDFU3<0:N>, and IDFU4<0:N> through a fuse set mounted on each of the plurality of the semiconductor devices 310<1:4> in response to the reset signal RESET.

The process of selecting any one semiconductor device among the plurality of the semiconductor devices 310<1:4> includes a step (step 726) where a semiconductor device having a device identification detection code that is the same as the device selection code IDSEL<0:N> sustains the device matching signal MATCHID generated in the inside in an enabled state (e.g., state corresponding to '1'), and a step (step 727) where a semiconductor device having a device identification detection code that is not the same as the device selection code IDSEL<0:N> among the plurality of the semiconductor devices 310<1:4> transitions the device matching signal MATCHID generated in the inside to a disabled state (e.g., state corresponding to '0').

The process of controlling the selected semiconductor device to perform the predetermined internal operation (step 718) after the semiconductor system enters the operation control mode includes performing (step 730) an internal operation predetermined by a semiconductor device 310<1>, 310<2>, 310<3>, or 310<4> which corresponds to the enabled signal (e.g., signal corresponding to '1') among the plurality of the device matching signals MATCHID1, MATCHID2, MATCHID3, and MATCHID4 after the semiconductor system enters the operation control mode (step 728); and not performing (i.e., following path "No" at step 729) an internal operation predetermined by a semiconductor device 310<1>, 310<2>, 310<3>, or 310<4> which corresponds to the disabled signal (e.g., signal corresponding to '0') among the plurality of the device matching signals MATCHID1, MATCHID2, MATCHID3, and MATCHID4 after the semiconductor system enters the operation control mode (step 728).

According to an exemplary embodiment of the present invention, which is described above, a semiconductor module including a plurality of semiconductor devices selects at least one semiconductor device based on a semiconductor device ID information for identifying a semiconductor device even after the semiconductor module is fabricated, and performs a internal operation, e.g., an electrical fuse operation control or a memory register setting operation, predetermined by the selected semiconductor device.

In this way, a semiconductor device having a defect may be selected and controlled even after the semiconductor module including the plurality of the semiconductor devices is fabricated. Therefore, production costs which may be wasted due to the defect of some semiconductor devices in the course of fabricating semiconductor modules may be saved.

While the present invention has been described with respect to the specific embodiments, it will be apparent to those skilled in the art that various changes and modifications may be made without departing from the spirit and scope of the invention as defined in the following claims.

For example, the logic gates and transistors illustrated in the above embodiments of the present invention may be implemented in different positions and/or with different configurations according to the polarity of an input signal.

What is claimed is:

1. A semiconductor device, comprising:
   a device identification detection code output block configured to output a device identification detection code to an outside of the semiconductor device;
   a code comparison block configured to compare a device selection code applied from the outside with the device identification detection code, and generate a device matching signal based on a comparison result; and
   an internal circuit block configured to decide whether to perform a predetermined internal operation based on the device matching signal.

2. The semiconductor device of claim 1, wherein the device identification detection code output block comprises:
   a device identification detection code generation unit configured to generate the device identification detection code; and
   a device identification detection code driving unit configured to drive the device identification detection code to a global input/output line and output the device identification detection code to the outside through a data input/output pad in response to a device identification output enable signal.

3. The semiconductor device of claim 2, wherein the device identification detection code is determined by a fuse set of the semiconductor device in response to a reset signal.

4. The semiconductor device of claim 2, wherein the device identification output enable signal indicates whether or not the semiconductor device enters an identification (ID) read mode.

5. The semiconductor device of claim 2, wherein the code comparison block comprises:
   a comparison unit configured to compare the device selection code, which is applied from the outside through the data input/output pad, with the device identification detection code;
   a device matching signal output unit configured to output a signal outputted from the comparison unit as the device matching signal in response to a device selection enable signal; and a forcible enabling unit configured to enable the device matching signal in response to the reset signal, regardless of the output signal of the comparison unit.

6. The semiconductor device of claim 5, wherein the device selection enable signal indicates whether or not the semiconductor device enters a device selection mode.

7. The semiconductor device of claim 5, wherein the code comparison block
   compares the device selection code applied from the outside through the predetermined data input/output pad with the device identification detection code in response to the device selection enable signal,
   enables the device matching signal and outputs an enabled device matching signal when the device selection code and the device identification detection code are the same,
   disables the device matching signal and outputs a disabled device matching signal when the device selection code and the device identification detection code are not the same, and
   enables the device matching signal and outputs an enabled device matching signal in response to the reset signal, regardless of whether the device selection code and the device identification detection code are the same or not.

8. The semiconductor device of claim 7, wherein the internal circuit block
   performs the predetermined internal operation, when the device matching signal is enabled, in response to an operation control enable signal which indicates whether or not the semiconductor device enters an operation control mode, and
   does not perform the predetermined internal operation, when the device matching signal is disabled, regardless of the operation control enable signal.

9. The semiconductor device of claim 8, wherein the predetermined internal operation is an operation of controlling an electrical fuse cutting operation for cutting an electrical fuse in the semiconductor device.

10. The semiconductor device of claim 8, wherein the predetermined internal operation is an operation of controlling a setting operation for setting a mode register set (MRS) in the semiconductor device.

11. A semiconductor module, comprising:
   a device identification detection code output block configured to output a plurality of device identification detection codes to an outside of the semiconductor module;
   a code comparison block configured to compare a device selection code applied from the outside with each of the plurality of the device identification detection codes, and generate a plurality of device matching signals based on comparison results; and
   a plurality of semiconductor devices corresponding to respective device identification detection codes and configured to determine whether to perform predetermined internal operations in response to the plurality of the device matching signals.

12. The semiconductor module of claim 11, wherein the device identification detection code output block outputs the plurality of device identification detection codes when the semiconductor module enters an identification (ID) read mode.

13. The semiconductor module of claim 12, wherein the device identification detection code output block
   outputs the plurality of the device identification detection codes, which are respectively generated in the plurality of the semiconductor devices in response to a reset signal, through a plurality of input/output pins to the outside of the semiconductor module in an enablement duration of a device identification output enable signal, which is a signal indicating whether to enter the ID read mode or not, and
   does not output the plurality of the device identification detection codes in a disablement duration of the device identification output enable signal.

14. The semiconductor module of claim 13, wherein the code comparison block
   compares the device selection code, which is applied from the outside of the semiconductor module through at least one of the plurality of input/output pins, with each of the plurality of the device identification detection codes to produce the comparison results,
   enables each of the device matching signals where the device selection code and the corresponding device identification detection code are the same, disables each of the device matching signals where the device selection code and the corresponding device identification detection code are not the same, and outputs each of the device matching signals to one of the plurality of the semiconductor devices, and
   enables all of the plurality of the device matching signals and outputs the enabled device matching signals to the plurality of the semiconductor devices, respectively, in response to the reset signal, regardless of the comparison results.

15. The semiconductor module of claim 11, wherein the code comparison block compares the device selection code with each of the plurality of the device identification detection codes, and generates the plurality of device matching signals when the semiconductor module enters a device selection mode.

16. The semiconductor module of claim 15, wherein the code comparison block generates the plurality of device matching signals in response to a device selection enable signal, which is a signal indicating whether to enter the device selection mode or not.

17. The semiconductor module of claim 11, wherein the plurality of the semiconductor devices determine whether to perform the predetermined internal operations, when the semiconductor module enters an operation control mode.

18. The semiconductor module of claim 17, wherein each of the plurality of the semiconductor devices
   generates the device identification detection code through a fuse set in response to the reset signal,
   performs the predetermined internal operation, when an applied device matching signal is enabled, in response to an operation control enable signal, which is a signal indicating whether to enter the operation control mode or not, and
   does not perform the predetermined internal operation, when the applied device matching signal is disabled, regardless of the operation control enable signal.

19. A semiconductor system, comprising:
   a plurality of semiconductor devices configured to output a plurality of predetermined device identification detection codes, respectively, compare a device selection code with each of the plurality of the device identification detection codes, and determine whether to perform predetermined internal operations based on the comparison results; and
   a controller configured to transfer at least one code of the plurality of the device identification detection codes to the plurality of the semiconductor devices as the device selection code.

20. The semiconductor system of claim 19, wherein the plurality of the semiconductor devices
- output the plurality of the device identification detection codes, generated through a fuse set in each semiconductor device, to the controller in response to a device identification output enable signal,
- compare the device selection code, applied from the controller, with each of the plurality of the device identification detection codes and determine whether to enable a plurality of device matching signals based on the comparison results in response to a device selection enable signal, and
- determine whether to perform the predetermined internal operations in response to an operation control enable signal, and the plurality of the device matching signals.

21. The semiconductor system of claim 20, wherein the device identification output enable signal is a signal indicating whether or not the system enters an identification (ID) read mode.

22. The semiconductor system of claim 21, wherein the device selection enable signal is a signal indicating whether or not the system enters a device selection mode.

23. The semiconductor system of claim 22, wherein the operation control enable signal indicates whether or not the system enters an operation control mode or not.

24. The semiconductor system of claim 20, wherein the semiconductor controller comprises:
- a device identification detection code storage block configured to store the plurality of the device identification detection codes respectively applied from the plurality of the semiconductor devices in response to the device identification output enable signal; and
- a device selection code output block configured to select at least one code among the plurality of the device identification detection codes stored in the device identification detection code storage block based on a selection standard and transfer the selected device identification detection code as the device selection code to the plurality of the semiconductor devices in response to the device selection enable signal.

25. A method for operating a system including a plurality of semiconductor devices and a controller of the plurality of the semiconductor devices, comprising:
- storing a plurality of device identification detection codes respectively corresponding to the plurality of the semiconductor devices in the controller when the system enters an identification (ID) read mode;
- selecting at least one among the plurality of the semiconductor devices by transferring at least one code among the plurality of the device identification detection codes stored in the controller as a device selection code to the plurality of the semiconductor devices when the system enters a device selection mode; and
- controlling the selected semiconductor device to perform a predetermined internal operation when the system enters an operation control mode.

26. The method of claim 25, further comprising:
- generating the plurality of the device identification detection codes through respective fuse sets of the plurality of the semiconductor devices in response to a reset signal.

27. The method of claim 26, wherein the selecting of at least one among the plurality of the semiconductor devices comprises:
- enabling a device matching signal of a semiconductor device having a device identification detection code which is the same as the device selection code; and
- disabling a device matching signal of a semiconductor device having a device identification detection code which is not the same as the device selection code.

28. The method of claim 27, wherein controlling the selected semiconductor device to perform the predetermined internal operation when the system enters the operation control mode comprises:
- performing the predetermined internal operation in a semiconductor device corresponding to an enabled signal among the plurality of the device matching signals after the system enters the operation control mode; and
- not performing the predetermined internal operation in a semiconductor device corresponding to a disabled signal among the plurality of the device matching signals after the system enters the operation control mode.

29. The method of claim 26, wherein, in the selecting of at least one among the plurality of the semiconductor devices, all the device matching signals of the plurality of the semiconductor devices are enabled in response to the reset signal, and the plurality of the semiconductor devices perform the predetermined internal operation when the system enters an operation control mode.

* * * * *